United States Patent
Ramaswamy et al.

(10) Patent No.: US 7,531,469 B2
(45) Date of Patent: May 12, 2009

(54) DOSIMETRY USING OPTICAL EMISSION SPECTROSCOPY/RESIDUAL GAS ANALYZER IN CONJUNCTION WITH ION CURRENT

(75) Inventors: Kartik Ramaswamy, San Jose, CA (US); Seon-Mee Cho, Santa Clara, CA (US); Tsutomu Tanaka, Santa Clara, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/681,313

(22) Filed: Mar. 2, 2007

(65) Prior Publication Data

US 2008/0075834 A1  Mar. 27, 2008

Related U.S. Application Data

(63) Continuation-in-part of application No. 10/971,772, filed on Oct. 23, 2004.

(51) Int. Cl.
*H01L 21/00* (2006.01)
(52) U.S. Cl. ...................... 438/795; 427/523
(58) Field of Classification Search ......... 438/795–798; 118/715, 723 E, 723 R; 216/60, 61; 427/523
See application file for complete search history.

(56) References Cited

U.S. PATENT DOCUMENTS

| | | | |
|---|---|---|---|
| 5,423,945 A | 6/1995 | Marks et al. | |
| 5,665,640 A | 9/1997 | Foster et al. | |
| 6,101,971 A * | 8/2000 | Denholm et al. | 118/723 E |
| 6,174,450 B1 * | 1/2001 | Patrick et al. | 216/61 |
| 6,286,362 B1 | 9/2001 | Coffman et al. | |
| 6,350,697 B1 | 2/2002 | Richardson et al. | |
| 6,395,150 B1 | 5/2002 | Can Cleemput et al. | |
| 6,413,321 B1 | 7/2002 | Kim et al. | |
| 6,461,972 B1 | 10/2002 | Kabansky | |
| 6,559,026 B1 | 5/2003 | Rossman et al. | |
| 6,579,805 B1 | 6/2003 | Bar-Gadda | |
| 6,617,794 B2 | 9/2003 | Barnes et al. | |
| 6,627,463 B1 | 9/2003 | Sarfaty | |
| 6,649,075 B1 | 11/2003 | Buie et al. | |
| 6,800,559 B2 | 10/2004 | Bar-Gadda | |
| 6,870,170 B1 | 3/2005 | Farley et al. | |
| 6,965,116 B1 | 11/2005 | Wagner et al. | |
| 7,037,813 B2 | 5/2006 | Collins et al. | |

(Continued)

FOREIGN PATENT DOCUMENTS

EP  0 942 453  9/1999

(Continued)

OTHER PUBLICATIONS

Sobolewski article, "Measuring the Ion Current in High-Density Plasmas Using Radio-Frequency Current and Voltage Measurements." Journal of Applied Physics, vol. 90, No. 6, Sep. 15, 2001, pp. 2660-2671.

*Primary Examiner*—Brook Kebede
(74) *Attorney, Agent, or Firm*—Patterson & Sheridan, LLP

(57) ABSTRACT

The present invention generally provides methods and apparatus for controlling ion dosage in real time during plasma processes. In one embodiment, ion dosages may be controlled using in-situ measurement of the plasma from a mass distribution sensor combined with in-situ measurement from an RF probe.

16 Claims, 5 Drawing Sheets

U.S. PATENT DOCUMENTS

| | | |
|---|---|---|
| 7,078,711 B2 | 7/2006 | Borden |
| 7,137,354 B2 | 11/2006 | Collins et al. |
| 2003/0013260 A1 | 1/2003 | Gossman et al. |
| 2003/0013314 A1 | 1/2003 | Ying et al. |
| 2003/0085205 A1 | 5/2003 | Lai et al. |
| 2005/0051271 A1 | 3/2005 | Collins et al. |
| 2005/0230047 A1 | 10/2005 | Collins et al. |
| 2006/0081558 A1 | 4/2006 | Collins et al. |
| 2006/0088655 A1 | 4/2006 | Collins et al. |

FOREIGN PATENT DOCUMENTS

| | | |
|---|---|---|
| EP | 1 158 071 | 11/2001 |
| JP | 07 004555 | 1/1995 |
| JP | 2000 150908 | 5/2000 |

* cited by examiner

US 7,531,469 B2

DOSIMETRY USING OPTICAL EMISSION SPECTROSCOPY/RESIDUAL GAS ANALYZER IN CONJUNCTION WITH ION CURRENT

CROSS-REFERENCE TO RELATED APPLICATIONS

This application is a continuation-in-part of co-pending U.S. patent application Ser. No. 10/971,772, filed Oct. 23, 2004, which is herein incorporated by reference.

BACKGROUND OF THE INVENTION

1. Field of the Invention

Embodiments of the present invention generally relate to method and apparatus for processing a substrate. Particularly, embodiments of the present invention relate to methods and apparatus for monitoring dosages of one or more species during plasma processing of semiconductor substrates.

2. Description of the Related Art

It is important to control ion dosage during plasma processes, such as plasma enhanced chemical vapor deposition (PECVD) process, high density plasma chemical vapor deposition (HDPCVD) process, plasma immersion ion implantation process (P3I), and plasma etch process. Ion implantation processes in integrated circuit fabrication particularly require instrumentation and control to achieve a desired ion dose on a semiconductor substrate.

The dose in ion implantation generally refers to the total number of ions per unit area passing through an imaginary surface plane of a substrate being processing. The implanted ions distribute themselves throughout the volume of the substrate. The principal variation in implanted ion density (number of ions per unit volume) occurs along the direction of the ion flux, usually the perpendicular (vertical) direction relative to the substrate surface. The distribution of ion density (ions per unit volume) along the vertical direction is referred to as the ion implantation depth profile. Instrumentation and control systems for regulating ion implant dose (ions per unit area) is sometimes referred to as dosimetry.

Ion implantation may be performed in ion beam implant apparatus and in plasma immersion ion implantation apparatus. Ion beam implant apparatus, which generate a narrow ion beam that must be raster-scanned over the surface of the substrate, typically implant only a single atomic species at one time. The ion current in such an apparatus is precisely measured and integrated over time to compute the actual dose. Because the entire ion beam impacts the substrate and because the atomic species in the beam is known, the ion implant dose can be accurately determined. This is critical in an ion beam implant apparatus, because it employs a D.C. ion source, which is subject to significant drift in its output current, and the various grids and electrodes employed in the beam implant machine drift as well (due to the susceptibility of a D.C. source to accumulation of deposited material on component surfaces). Accordingly, precise dosimetry is essential in an ion beam implant apparatus. The precisely monitored ion beam current is integrated over time to compute an instantaneous current implant dose, and the process is halted as soon as the dose reaches a predetermined target value.

In contrast, plasma immersion ion implantation reactors present a difficult problem in dosimetry. Typically, the atomic weight of the ions incident on the substrate cannot be precisely determined because such a reactor employs a precursor gas containing the desired ion implantation species as well as other species. For example, since pure boron is a solid at room temperature, plasma immersion ion implantation of boron must employ a multi-species gas such as $B_2H_6$ as the plasma precursor, so that both boron and hydrogen ions are incident on the substrate. As a result, determining the boron dose from a measured current is difficult. Another difficulty in implementing dosimetry in a plasma immersion ion implantation reactor is that the plasma ions impact the entire substrate continuously, so that it is difficult to effect a direct measurement above the substrate of the total ion current to the substrate. Instead, the dose must be indirectly inferred from measurements taken over a very small area. This is particularly true of reactors employing RF (Radio Frequency) plasma source power or RF plasma bias power.

Plasma immersion ion implantation reactors employing D.C. (or pulsed D.C.) plasma source power are susceptible to drift in the plasma ion current due to deposition of material on internal reactor components from the plasma. Such reactors therefore require precise real-time dosimetry. This problem has been addressed by providing a small orifice in the wafer support pedestal or cathode outside of the substrate periphery, for plasma ions to pass through into the interior volume of the cathode. An electrode sometimes referred to as a Faraday cup faces the orifice and is biased to collect the ions passing through the orifice. The interior of the cathode can be evacuated to a slightly lower pressure than the plasma chamber to ensure efficient collection of ions through the orifice. A current sensor inside the cathode interior measures the current flowing between the ion-collecting electrode and its bias source. This current can be used as the basis of a dosimetry measurement. One problem with such an arrangement is that the current measurement cannot distinguish between different atomic species, and therefore cannot provide an accurate measurement of the species of interest (e.g., boron). Another problem is that the transmission of the measured current from the current sensor inside the cathode interior to an external controller or processor can be distorted by the noisy electromagnetic environment of the plasma reactor.

Another problem is that the orifice in the cathode constitutes an intrusion upon the ideal plasma environment, because the orifice can distort the electric field in the vicinity of the substrate periphery. Furthermore, plasma passing through the orifice can cause problems by either sputtering the orifice surfaces or by depositing on the orifice interior surfaces, requiring the periodic cleaning of the orifice interior.

In plasma immersion ion implantation reactors employing RF plasma source power, precise or real-time dose measurement typically was not critical. This is due in part to the fact that an RF plasma is relatively impervious to deposition of material on internal chamber components, so that the ion flux at the wafer surface does not drift significantly, compared to a reactor employing a D.C. plasma source. Moreover, real-time dose measurement in such a reactor is difficult. For example, the harsh RF environment of such a reactor would distort an ion current measurement taken inside the cathode (as described above) as it is conveyed to an external controller or processor. To avoid such problems, implant dose can be reliably controlled based upon the predicted or estimated time required to reach the target implant dose. However, a real-time does control is more and more in need as the feature size becomes smaller and smaller in the semiconductor devices.

Therefore, there is a need for precise real-time dosimetry in a plasma processing chamber, such as an RF plasma immersion ion implantation reactor.

SUMMARY OF THE INVENTION

The present invention generally provides methods and apparatus for controlling ion dosage in real time during plasma processes.

One embodiment of the present invention provides a method for processing a substrate comprising positioning the substrate in a plasma reactor configured to perform a plasma process, generating a plasma in the plasma reactor to start the plasma process by supplying a RF bias to the plasma reactor, obtaining a value of the at least one attribute of the plasma using a first sensor configured to monitor at least one attribute of a plasma generated in the plasma reactor, obtaining a value of the at least one attribute of the RF bias power using a second sensor configured to monitor at least one attribute of a RF bias power configured to supply the RF bias to the plasma reactor, and determining a real time dose value of one or more ion species in the plasma from the value of the at least one attribute of the plasma and the value of the at least on attribute of the RF bias power.

Another embodiment of the present invention provides an apparatus for processing a substrate comprising a process chamber defining a process volume, a conductive support pedestal positioned in the process volume, a gas distribution assembly connected to a gas panel and positioned parallel the conductive support pedestal, wherein an RF plasma bias power supply is coupled between the gas distribution assembly and the conductive support pedestal, a first sensor configured to monitor one or more attributes of a plasma generated in the process volume, a second sensor configured to monitor one or more attribute of the RF plasma bias power supply, and a controller coupled to the first and second sensors, wherein the controller is configured to receive and analyze signals from the first and second sensors.

Yet another embodiment of the present invention provides a method for implanting a desired dose of a material into a substrate comprising positioning the substrate in a plasma reactor having a RF bias power configured to generate a plasma in the plasma reactor, generating a plasma comprising the material in the plasma reactor using the RF bias power, obtaining a value of the attribute of the material in the plasma using a first sensor configured to monitor an attribute of the plasma in the plasma reactor, obtaining a value of the at least one attribute of the RF bias power using a second sensor configured to monitor at least one attribute of the RF bias power, determining a real time dosage value of the material using the value of the attribute of the material and the value of the at least one attribute of the RF bias power, and terminating the plasma when the real time dosage value is within an error range of the desired dose.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide methods for controlling ion dosages in real time during plasma processes and apparatus for performing the methods.

Figure 1:
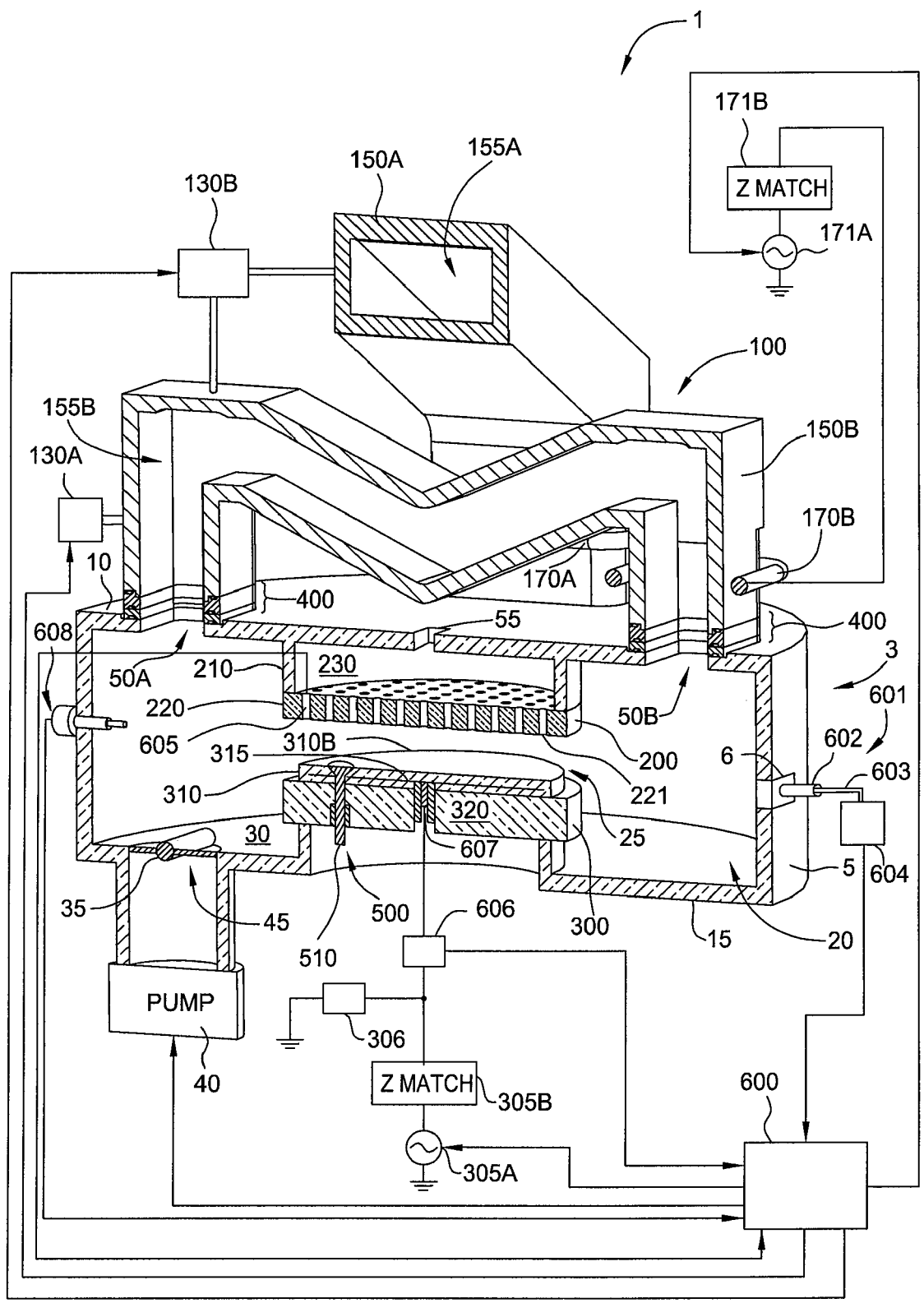
FIG. 1 schematically illustrates an isometric cross-sectional view of a plasma chamber in accordance with one embodiment of the present invention.

FIG. 1 schematically illustrates an isometric cross-sectional view of a plasma chamber 1 in accordance with one embodiment of the present invention. The plasma chamber 1 may be configured for a plasma enhanced chemical vapor deposition (PECVD) process, a high density plasma chemical vapor deposition (HDPCVD) process, an ion implantation process, an etch process, and other plasma processes.

The plasma chamber 1 comprises a toroidal plasma source 100 coupled to a body 3 of the plasma chamber 1. The body 3 comprises sidewalls 5 coupled to a lid 10 and a bottom 15, which bounds an interior volume 20. Other examples of the plasma chamber 1 may be found in U.S. Pat. No. 6,939,434, filed Jun. 5, 2002 and issued on Sep. 6, 2005 and U.S. Pat. No. 6,893,907, filed Feb. 24, 2004 and issued May 17, 2005, both of which are incorporated by reference herein in their entireties.

The interior volume 20 includes a processing region 25 formed between a gas distribution assembly 200 and a substrate support 300. A pumping region 30 surrounds a portion of the substrate support 300. The pumping region 30 is in selective communication with a vacuum pump 40 through a valve 35 disposed in a port 45 formed in the bottom 15. In one embodiment, the valve 35 is a throttle valve adapted to control the flow of gas or vapor from the interior volume 20 and through the port 45 to the vacuum pump 40. In one embodiment, the valve 35 operates without the use of o-rings, and is further described in United States Patent Publication No. 2006/0237136, filed Apr. 26, 2005, which is incorporated by reference in its entirety.

Figure 2:
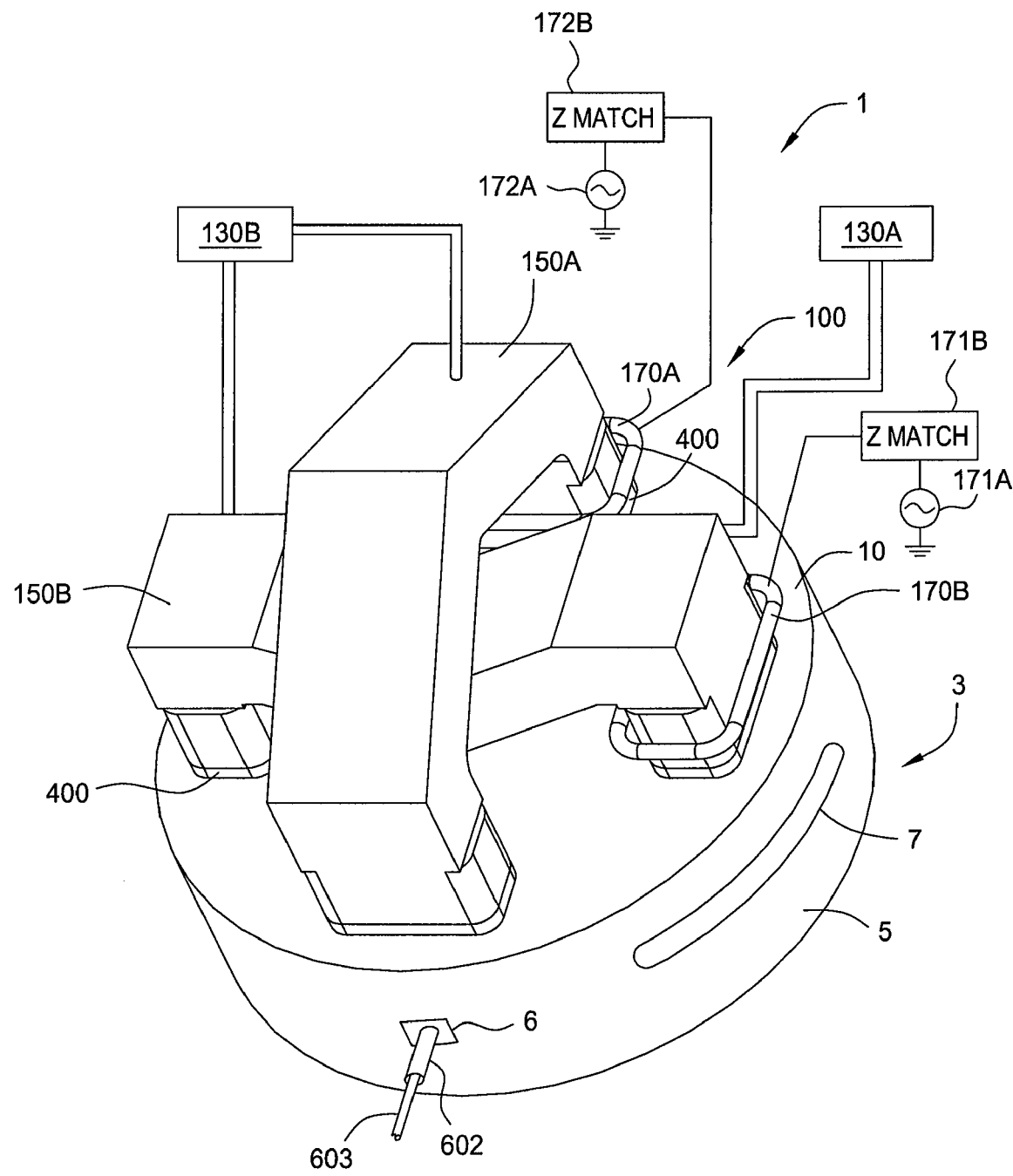
FIG. 2 schematically illustrates an isometric top view of the plasma chamber of FIG. 1.

A toroidal plasma source 100 is disposed on the lid 10 of the body 3. In one embodiment, the toroidal plasma source 100 comprises a first conduit 150A having a general "U" shape, and a second conduit 150B having a general "M" shape. The first conduit 150A and the second conduit 150B each include at least one antenna 170A and 170B respectively. The antennas 170A and 170B are configured to form an inductively coupled plasma within an interior region 155A/155B of each of the conduits 150A/150B, respectively. As shown in FIG. 2, each antenna 170A/170B may be a winding or a coil coupled to a power source, such as a RF plasma power source 171A/172A. An RF impedance matching systems 171B/172B may also be coupled to each antenna 170A/170B. Process gases, such as helium, argon, and other gases, may be provided to an interior region 155A, 155B of each of the conduits 150A, 150B, respectively. In one embodiment, the process gases may contain a dopant containing gases that is supplied to the interior regions 155A/155B of each conduit 150A/150B. In one embodiment, the process gases may be delivered to the toroidal plasma source 100 from a gas panel 130B. In another embodiment, the process gases may be delivered through the gas distribution assembly 200 from a gas panel 130A connected to a port 55 formed in the body 3 of the plasma chamber 1.

In one embodiment, each opposing end of the conduits 150A/150B are coupled to respective ports 50A-50D (only 50A and 50B are shown in this view) formed in the lid 10 of the plasma chamber 1. During processing, a process gas is supplied to the interior region 155A/155B of each of the conduits 150A/150B, and RF power is applied to each antenna 170A/170B, to generate a circulating plasma path that travels through the ports 50A-50D and the processing region 25. Specifically, in FIG. 1, the circulating plasma path travels through port 50A to port 50B, or vise versa, through the processing region 25 between the gas distribution assembly 200 and the substrate support 300. Each conduit 150A/150B comprises a plasma channeling means 400 coupled between respective ends of the conduit 150A/150B and the ports 50A-50D. In one embodiment, the plasma channeling means 400 is configured to split and widen the plasma path formed within each of the conduits 150A/150B.

The gas distribution assembly 200 comprises an annular wall 210 and a perforated plate 220. The annular wall 210, the perforated plate 220 and the lid 10 define a plenum 230. The perforated plate 220 includes a plurality of openings 221 formed therethrough in a symmetrical or non-symmetrical pattern or patterns. In one embodiment, the dopant containing process gases may be delivered to processing region 25 from the gas distribution assembly 200 connected to the gas panel 130A. The process gases, such as dopant-containing gases, may be provided to the plenum 230 from the port 55. Generally, the dopant-containing gas is a chemical consisting of the dopant impurity atom, such as boron (a p-type conductivity impurity in silicon) or phosphorus (an n-type conductivity impurity in silicon) and a volatile species such as fluorine and/or hydrogen. Thus, fluorides and/or hydrides of boron, phosphorous or other dopant species such as arsenic, antimony, etc., can be dopant gases. For example where a boron dopant is used the dopant-containing gas may contain boron trifluoride ($BF_3$) or diborane ($B_2H_6$). The gases may flow through the openings 221 and into the processing region 25 below the perforated plate 220. In one embodiment, the perforated plate 220 is RF biased to help generate and/or maintain a plasma in the processing region 25.

The substrate support 300 comprises an upper plate 310 and a cathode assembly 320. The upper plate 310 has a smooth substrate supporting surface 310B configured to support a substrate thereon. The upper plate 310 comprises an embedded electrode 315 which is connected to a DC power source 306 to facilitate electrostatic attraction between a substrate and the substrate supporting surface 310B of the upper plate 310 during process. In one embodiment, the embedded electrode 315 may also be used as an electrode for providing capacitive RF energy to the processing region 25. The embedded electrode 315 may be coupled to a RF plasma bias power 305A via an RF impedance matching circuit 305B.

The substrate support 300 may also include a lift pin assembly 500 that contains a plurality of lift pins 510 configured to transfer one or more substrates by selectively lifting and supporting a substrate above the upper plate 310 and are spaced to allow a robot blade to position therebetween.

FIG. 2 schematically illustrates an isometric top view of the plasma chamber 1 shown in FIG. 1. The sidewall 5 of the plasma chamber 1 have a substrate port 7 that may be selectively sealed by a slit valve (not shown). Process gases are supplied to the gas distribution assembly 200 by the gas panel 130A coupled to the port 55. One or more process gases may be supplied to the toroidal sources 150A, 150B through the gas panel 130B.

The plasma chamber 1 further comprises a controller 600 configured to monitor and control processes performed in the plasma chamber 1. The controller 600 may be connected with one or more sensors and configured to sampling, analyzing and storing sensor data. In one embodiment, the controller 600 may have the capacity to perform control tasks for different processes. The controller 600 may be connected to operating parts of the plasma chamber 1 and send control signals to the operating parts. The controller 600 may perform a closed loop control task by adjusting process parameters according to sensor data to achieve desired process result. In one embodiment of the present invention, the controller 600 may be configured to perform dosage control of one or more species, end point detection, and other control tasks.

In one embodiment, a RF probe 606 is positioned on a feedpoint 607 between the RF impedance matching circuit 305B and the embedded electrode 315. The RF probe 606 may be a voltage/current coupler or a directional coupler. The RF probe 606 may be replaced by individual instruments, such as a voltage probe and a current probe. The RF probe 606 is capable of simultaneously or nearly simultaneously measuring RF voltage, RF current and an instantaneous impedance angle between the RF voltage and the RF current.

Total current or real part of current (product of total current and cosine of impedance angle, or quotient of absorbed bias power with respect to bias voltage), may be measured directly or calculated from indirect measurements from the RF probe 606. The measured current many be the RMS (root means squared) current, the peak current or the peak to peak current. The measured current may be used to estimate ion dose rate and/or dose, which may be used to control dosage or determine an endpoint. The measured current may be used to control dose-rate.

During a plasma processing, the RF current measured by the RF probe 606 substantially reflects a total current of radials flowing from a ground electrode, such as the perforated plate 220, to a RF biased electrode (or the substrate disposed on the biased electrode), such as the embedded electrode 315. In one embodiment of the present invention, a transformation may be computed to transform a RF voltage/current value at the feedpoint 607 to a RF voltage/current value at a substrate positioned on the embedded electrode 315. The transform is described in detail in accordance of FIG. 4.

In one embodiment, ion current may be the RF current value corresponding to the minimum RF voltage value. Detailed explanation of determining ion current value using the minimum value of RF voltage can be found in "Measuring the Ion Current in High-density Plasma Using Radio Frequency Current and Voltage Measurements", by Mark A. Sobolewski, *Journal of Applied Physics*, Volume 90, No. 6, pp. 2660-2671, 2001.

Current value obtained from the RF probe 606, however, is usually not equal to a current of one or more ion species intended to conduct the plasma process because, at least in part, there are other ion species in the plasma. For example, Boron ion is intended to be implanted into a substrate during a plasma implantation using $B_2H_6$ as the plasma precursor. The plasma may include ion species $B^{3+}$ and $H^+$ and both boron and hydrogen ions may incident on the substrate. The current value obtained from the RF probe 606 may include current of both boron and hydrogen ions. To obtain desired dosage of Boron, it is necessary to obtain a ratio of the boron current relative to the total ion current measured by the RF probe.

In one embodiment of the present invention, ratio of one or more ion species of interest may be obtained in-situ using a mass distribution sensor configured to monitor a plasma generated in the plasma reactor. The mass distribution sensor may be an optical emission spectrometer, a residual gas analyzer, a ground side mass spectrometer, or any suitable sensor.

In one embodiment, as shown in FIG. 1, an optical emission spectrometer 601 is disposed adjacent a quartz window 6 formed on the body 3. The optical emission spectrometer 601 is configured to quantitatively measure optical emissions from excited species in the plasma generated inside the plasma chamber 1. Excited species in a plasma may decay back from the excited energy level to the lower energy level of emitting light. Since the transition is between distinct atomic energy levels, wavelength of the emitted light may be used to identify the excited species. In one embodiment, intensity of the emitted lights may reflect concentration or distribution of different species in a plasma including one or more species. Plasma generally generate electromagnetic radiation that includes emissions having wavelengths in the optical spectrum, i.e., from about 180 nm to about 1100 nm. A portion of these emissions can be detected by a spectrometer, such as the optical emission spectrometer 601, or other suitable devices such as a monochromator of a spectral filter equipped with one or more photodiodes.

The optical emission spectrometer (OES) 601 may comprise a lens 602 disposed next to the quartz window 6. The lens 602 may be configured to collimate radiation of the plasma passes through the quartz window 6 in to an optical fiber cable 603 connected to the spectrometer 604. The spectrometer 604 spectrally separates the radiation based on wavelength and generates detection signals for one or more spatially separated wavelengths. A data acquisition device in the controller 600 may be used to collect data representing separated wavelength, hence properties of the ion species in the plasma, at a periodic sampling rate. The collected data may be processed and analyzed for generating control singles to the RF plasma bias power 305A, the RF plasma source powers 171A/172A, the gas panels 130A/130B, the pump 40, or any other controllable components of the plasma chamber 1 to adjust process parameters, for example pressure, power intensities, flow rates, process duration.

In one embodiment, a residual gas analyzer 608, shown in FIG. 1, may be disposed on the sidewalls 5. The residual gas analyzer 608 is in fluid communication with the process region 25 so that the residual gas analyzer 608 can separate, identify and measure the quantity of all species in the process region 25. The residual gas analyzer 608 can monitor real time plasma behavior and provide data to compute ratio of different ion species in the plasma. The residual gas analyzer 608 is connected to the controller 600 which may process and analyze measurements from the residual gas analyzer 608 to generate control singles to the RF plasma bias power 305A, the RF plasma source powers 171A/172A, the gas panels 130A/130B, the pump 40, or any other controllable components of the plasma chamber 1 to adjust process parameters, for example pressure, power intensities, flow rates, or process duration.

In another embodiment, a mass spectrometer 605 configured to measure distribution of different species in the plasma may be positioned in the gas distribution assembly 200. Similar to the residual gas analyzer 608 or the optical emission spectrometer 601, the mass spectrometer 605 may monitor the plasma in real time and provide measurement to the controller 600 which may perform a closed loop control to achieve desired result during a plasma process.

Figure 3:
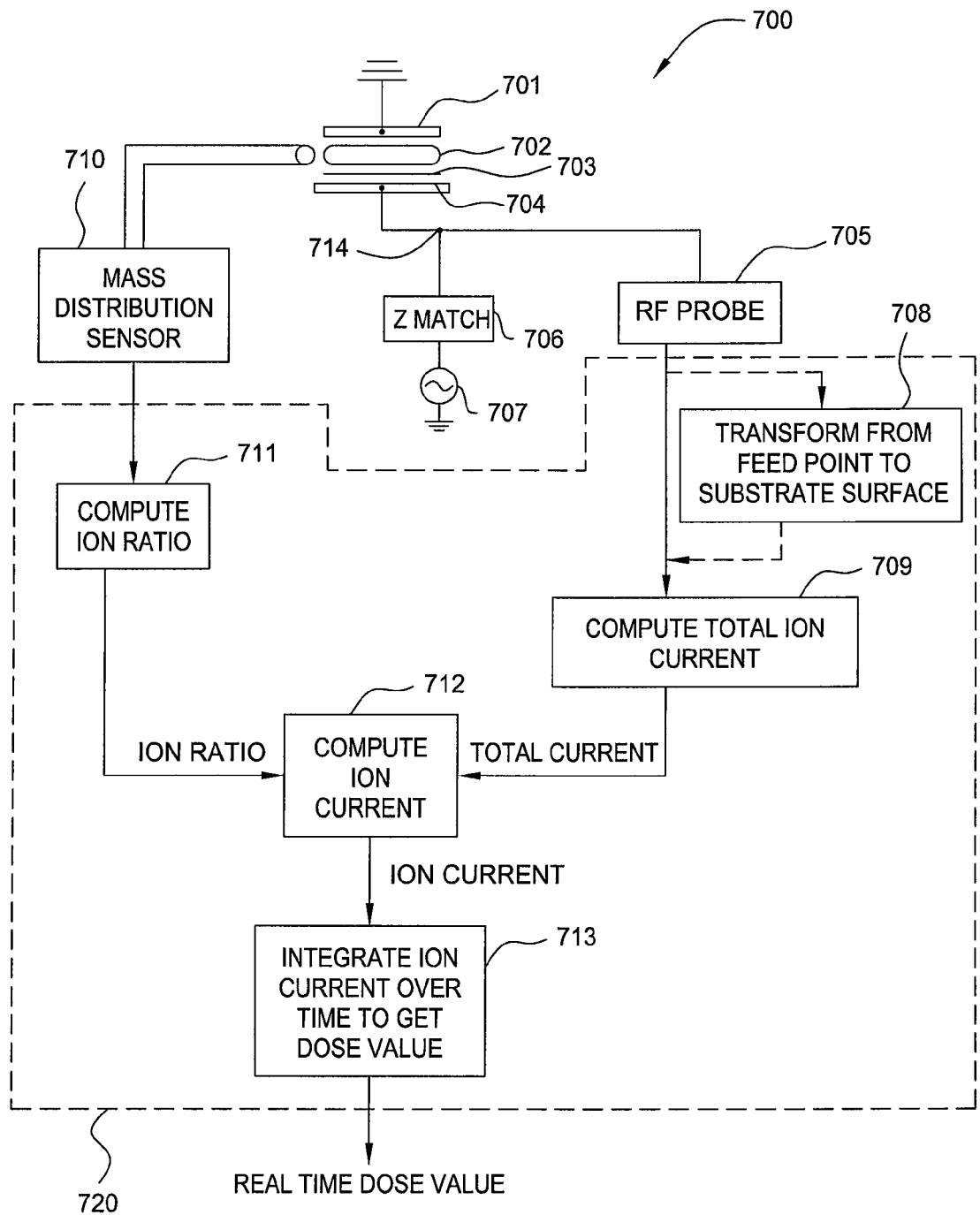
FIG. 3 schematically illustrates an exemplary method for monitoring real time dosage using a mass distribution sensor in conjunction with a current sensor.

In one embodiment of the present invention, a mass distribution sensor, such as the optical emission spectrometer 601, the residual gas analyzer 608, the mass spectrometer 605, or any other suitable devices, may be used in conjunction with a plasma current sensor, such as the RF probe 606, to monitor real time dosage of one or more ion species of interest, to detect an endpoint, or to achieve desired processing result. FIG. 3 schematically illustrates an exemplary method 700 for monitoring real time dosage using a mass distribution sensor in conjunction with a current sensor.

As shown in FIG. 3, a substrate 703 is processed by a plasma 702 generated between an electrode 704 and a grounded electrode 701. The electrode 704 is connected with a bias power supply 707 through an impedance matching circuit 706 at a feedpoint 714. The plasma 702 is generated by an RF power supplied by the bias power supply 707.

An RF probe 705 is connected to the electrode 704 at the feedpoint 714. The RF probe 705 is configured to monitor the real time voltage, current and phase of the RF bias power supplied to the electrode 704. A mass distribution sensor 710 is positioned to monitor the real time mass distribution of one or more ion species in the plasma. The mass distribution sensor 710 may be one of an optical emission spectrometer, a residual gas analyzer, or a mass spectrometer. Both of the mass distribution sensor 710 and the RF probe 705 are connected to a processor 720 configured to calculate dosage values in real time according to the measurements from the mass distribution sensor 710 and the RF probe 705.

The processor 720, in one embodiment, may be programmed to estimate the ion implantation dose. This may be accomplished as illustrated in the flow diagram inside the processor 720 shown in FIG. 3. The processor 720 may track the incoming stream of instantaneous current values from the RF probe 705. A total ion current may be calculated in block 709 from the input of the RF probe 705. This total ion current may be obtained by multiplying each value of current by the cosine of the impedance angle from the RF sensor 705. For more accurate performance, the voltage, current and impedance angle measurements of the RF probe 705 may be transformed, in block 708, from the feedpoint 714 to the surface of the substrate 703, in accordance with a feature that is discussed later in this specification.

Simultaneously, a mass distribution data may be input to the processor 720 from the mass distribution sensor 710. Instantaneous ratios of one or more ion species of interest in the plasma 702 may be calculated, in block 711, from the measurements of the mass distribution sensor 710.

The ion ratio and the total ion current is then combined together to obtain an actual ion current of the one or more ion species of interest, in block 712 of FIG. 3. In one embodiment, the actual ion current of one ion species may be obtained by multiplying the ion ratio, the total ion current, the reciprocal of the electron charge of the ion species, and the reciprocal of surface area of the substrate 703.

A real time dosage value of the ion species of interest may be obtained by integrating the actual ion current over time, in block 713.

Figure 4:
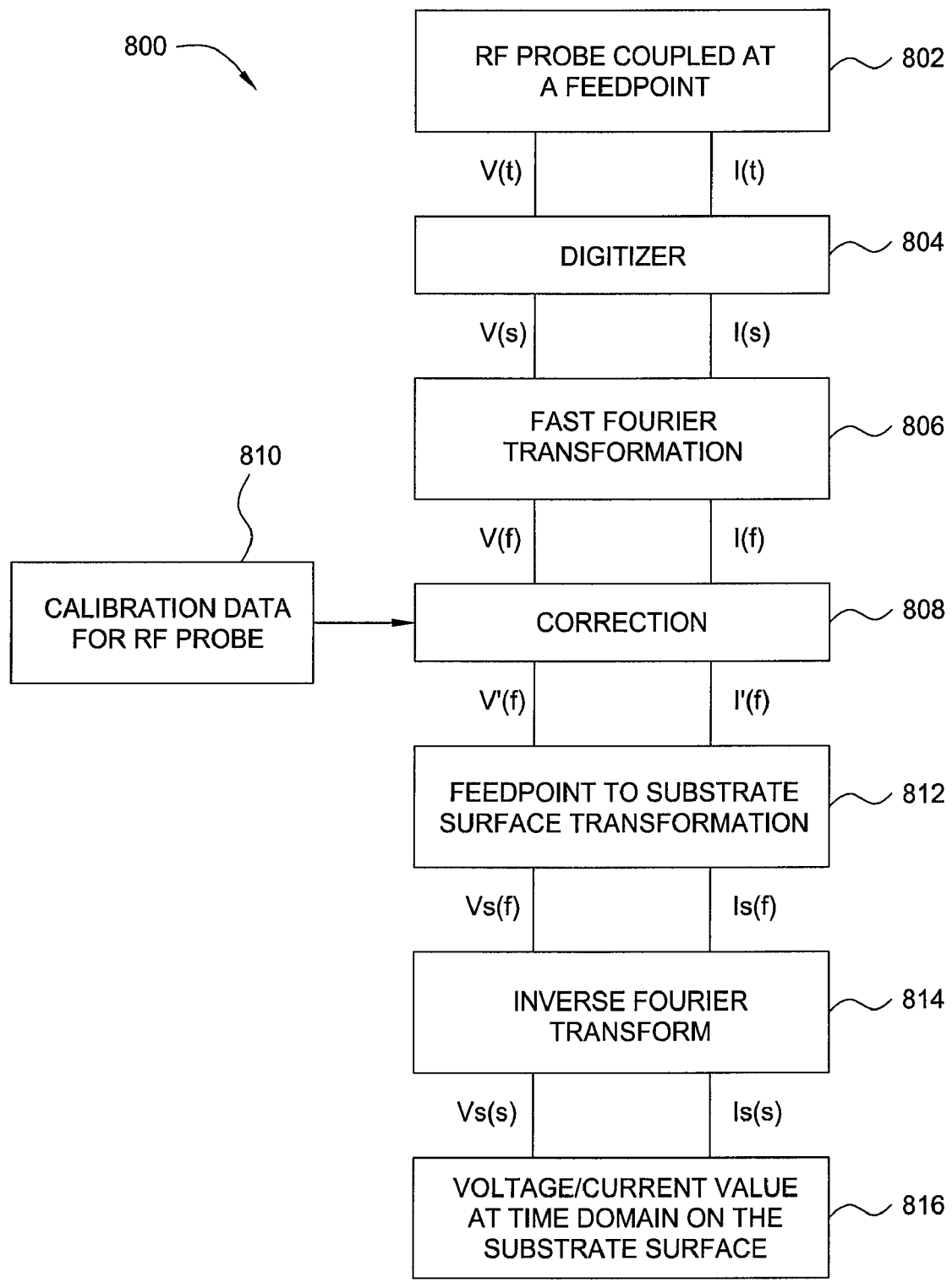
FIG. 4 schematically illustrates a method for transforming current/voltage values from a feedpoint to a substrate surface positioned adjacent the plasma.

FIG. 4 schematically illustrates a method 800 for transforming current/voltage values from a feedpoint to a substrate surface positioned adjacent the plasma. The method 800 may be used in the block 708 of FIG. 3.

As shown in FIG. 4, voltage/current input from a RF probe 802 positioned at a feedpoint is first digitized in a digitizer 804 to discrete values in time domain. A fast Fourier Transformation maybe performed in step 806 to transform the voltage/current measurement into the frequency domain. In step 808, correction may be added to the voltage/current measurement using calibration data 810 for the RF probe. Detailed description of calibrating the RF probe may be found in co-pending U.S. patent application Ser. No. 10/971,772, filed Oct. 23, 2004, which is herein incorporated by reference.

In step 812, a feedpoint to substrate surface transformation may conducted to the corrected voltage/current measurement in the frequency domain. In step 814, an inverted Fourier transform may be performed to the transformed voltage/current value in the frequency domain. The instantaneous voltage/current value on the substrate surface in the time domain is then obtained in step 816 and may be used in a precise process monitoring and controlling. Detailed description of this feedpoint to substrate surface transformation may be found in co-pending U.S. patent application Ser. No. 10/971,772, filed Oct. 23, 2004, which is herein incorporated by reference.

Figure 5:
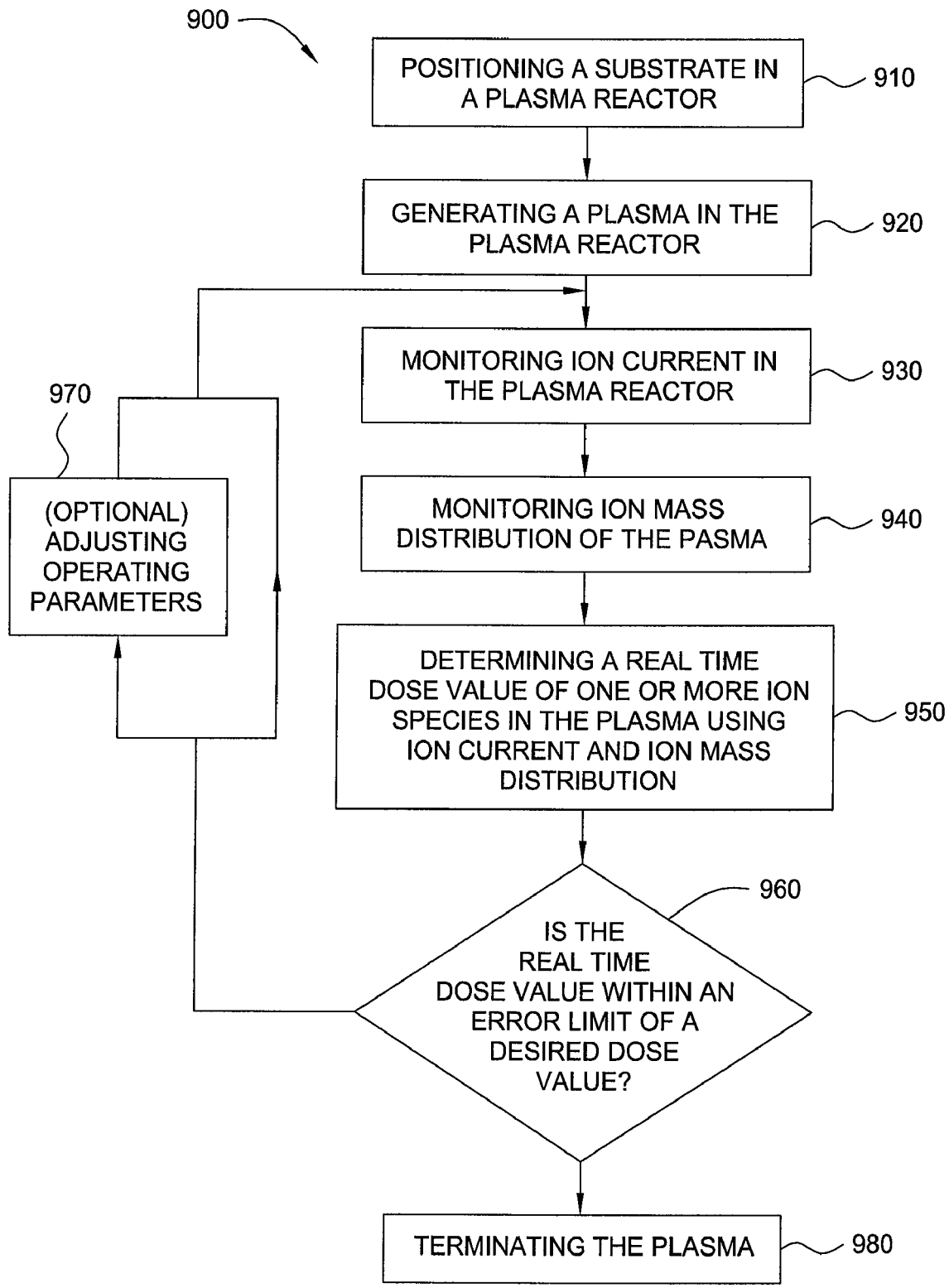
FIG. 5 illustrates a flow chart of a method for endpoint detection for a plasma processing in accordance with one embodiment of the present invention.

FIG. 5 illustrates a flow chart of a method 900 for endpoint detection for a plasma processing in accordance With one embodiment of the present invention.

In step 910, a substrate to be processed may be positioned in a plasma reactor.

In step 920, the plasma process may be started. This step may include pumping down the plasma chamber, flowing in processing gases, and/or generating a plasma.

In step 930, total ion current of the plasma in the plasma reactor may be monitored using a RF probe. For example, an RF probe connected to a RF bias power supply near a feed point. In one embodiment, a feedpoint to substrate surface transformation may be performed to obtain total ion current near the substrate surface.

In step 940, mass distribution of the plasma in the plasma reactor may be monitored using a mass distribution sensor, such as an optical emission spectrometer, a residual gas analyzer, or a mass spectrometer. Ratio of one or more ion species of interest may be calculated instantaneously from the measurement of the mass distribution sensor.

In step 950, the real time dose value of the one or more ion species of interest may be calculated using the ratio of the one or more ion species calculated in step 940 and the total ion current calculated in step 930. Calculation of the real time dose value may comprise calculating actual ion current of the ion species and integrating the actual ion current over time. Calculation the actual ion current may comprise multiplying the ratio of the ion species, the total ion current, the reciprocal of the electron charge of the ion species, and the reciprocal of surface area of the substrate.

In step 960, the real time dose value may be compared to a desired dose value. if the real time dose value is within an error limit of the desired dose value, the process may be terminated in step 980. Alternatively, the process may be continued with repeating steps of 930, 940, 950 and 960. In one embodiment, step 970 may be performed to adjust operating parameters to according to the real time dose value to achieve a close loop control.

While the ion implantation of Boron (B) is described in the present application, the method and apparatus of the present invention may be used to monitor and control dosage of Arsenic (As), Phosphorus (P), Hydrogen (H), Oxygen (O), Fluorine (F), Silicon (Si), and other species used in a plasma process.

While method and apparatus of the present invention is described in accordance with a plasma immersion ion implantation process, persons skilled in the art may find it suitable to other plasma processes, such as a plasma enhanced chemical vapor deposition (PECVD) process, a high density plasma chemical vapor deposition (HDPCVD) process, an ion implantation process, and an etch process.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
   positioning the substrate in a plasma reactor configured to perform a plasma process;
   generating a plasma in the plasma reactor to start the plasma process by supplying a RF bias from a RF bias power coupled to the plasma reactor;
   obtaining a value of the at least one attribute of the plasma using a first sensor configured to monitor at least one attribute of the plasma generated in the plasma reactor;
   obtaining a value of total ion current using a second sensor configured to monitor at least one attribute of the RF bias power coupled to the plasma reactor; and
   determining a real time dose value of one or more ion species in the plasma from the value of the at least one attribute of the plasma and the value of total ion current.

2. The method of claim 1, further comprising adjusting parameters of the plasma reactor according to the real time dosage value of the one or more ion species in the plasma.

3. The method of claim 1, wherein the at least one attribute of the plasma comprises a ratio of the one or more ion species over total ions in the plasma.

4. The method of claim 3, wherein the first sensor is one of an optical emission spectrometer, a mass spectrometer and a residual gas analyzer.

5. The method of claim 3, wherein the second sensor is a RF voltage/current probe connected to a feedpoint of the RF bias power.

6. The method of claim 1, wherein determining the real time dose value of the one or more ion species in the plasma comprises:
   determining a real time value of a ratio of the one or more ion species over total ions in the plasma using the real time value of the at least one attribute of the plasma measured by the first sensor;
   determining a real time value of a total ion current near a feedpoint of the RF bias power measured by the second sensor coupled to the feedpoint of the RF bias power;
   calculating a current value of the one or more ion species by multiplying the ratio of the one or more ion species in the plasma and the total ion current; and
   integrating the current value of the one or more ion species over time.

7. The method of claim 6, wherein determining the real time value of the total current comprises transforming the total ion current near the feedpoint of the RF bias power to a total ion current near a surface of the substrate.

8. The method of claim 7, wherein transforming the total ion current near the feedpoint of the RF bias power to a total ion current near a surface of the substrate comprises:
   transforming measurement at the feedpoint from time domain to frequency domain;
   correcting the measurement in frequency domain using calibration data of the second sensor; and
   transforming corrected measurement in frequency domain to time domain.

9. The method of claim 1, wherein the one or more ions comprises Boron (B), Arsenic (As), Phosphorus (P), Hydrogen (H), Oxygen (O), Fluorine (F), Silicon (Si), or combinations thereof.

10. The method of claim 1, wherein the plasma process comprises one of a plasma enhanced chemical vapor deposition (PECVD) process, a high density plasma chemical vapor deposition (HDPCVD) process, an ion implantation process, and a plasma etching process.

11. A method for implanting a desired dose of a material into a substrate, comprising:
positioning the substrate in a plasma reactor having a RF bias power configured to generate a plasma in the plasma reactor;
generating a plasma comprising ions of the material in the plasma reactor using the RF bias power;
obtaining a value of an attribute of the ions of the material in the plasma using a first sensor configured to monitor an attribute of the plasma in the plasma reactor;
obtaining a value of a total current of the RF bias power using a second sensor configured to monitor at least one attribute of the RF bias power;
determining a real time dosage value of the material using the value of the attribute of the ions of the material and the value of the of total current of the RF bias power; and
terminating the plasma when the real time dosage value is within an error range of the desired dose.

12. The method of claim 11, wherein the attribute of the ions of the material is a ratio of the ion of the material over total ions in the plasma.

13. The method of claim 12, wherein the first sensor is one of an optical emission spectrometer, a mass spectrometer and a residual gas analyzer.

14. The method of claim 11, wherein the second sensor is a RF voltage/current probe configured to measure voltage, current and phase of the RF bias power, and the second sensor is coupled to a feedpoint of the RF bias power.

15. The method of claim 14, further comprising transforming the total current of the RF bias power to a total ion current near a surface of the substrate.

16. The method of claim 15, wherein transforming the total current of the RF bias power to a total ion current near a surface of the substrate comprises:
transforming the total current of the RF bias power from time domain to frequency domain;
correcting the total current of the RF bias power in frequency domain using calibration data of the second sensor; and
obtaining the total current near the surface of the substrate by transforming corrected total current in frequency domain to time domain.

* * * * *

UNITED STATES PATENT AND TRADEMARK OFFICE
CERTIFICATE OF CORRECTION

PATENT NO.         : 7,531,469 B2
APPLICATION NO.    : 11/681313
DATED              : May 12, 2009
INVENTOR(S)        : Ramaswamy et al.

It is certified that error appears in the above-identified patent and that said Letters Patent is hereby corrected as shown below:

Column 9, Line 21, please delete "With" and insert --with-- therefor;

Column 11, Claim 11, Line 25, please delete "of" before total.

Signed and Sealed this

Twenty-eighth Day of July, 2009

JOHN DOLL
*Acting Director of the United States Patent and Trademark Office*